(12) United States Patent
Monkowski et al.

(10) Patent No.: US 7,797,652 B2
(45) Date of Patent: Sep. 14, 2010

(54) IMPLEMENTING INTEGRATED CIRCUIT YIELD ESTIMATION USING VORONOI DIAGRAMS

(75) Inventors: Michael D. Monkowski, New Windsor, NY (US); Patricia A. O'Neil, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 12/174,924

(22) Filed: Jul. 17, 2008

(65) Prior Publication Data

US 2010/0017762 A1    Jan. 21, 2010

(51) Int. Cl.
   *G06F 17/50* (2006.01)
(52) U.S. Cl. ............... 716/4; 716/2; 716/5; 716/6; 716/8; 700/110; 700/121
(58) Field of Classification Search ............... 716/2, 716/4–6, 8; 700/110, 121
   See application file for complete search history.

(56) References Cited

U.S. PATENT DOCUMENTS

| | | |
|---|---|---|
| 6,178,539 B1 | 1/2001 | Papadopoulou et al. |
| 6,317,859 B1 | 11/2001 | Papadopoulou |
| 6,810,510 B2 | 10/2004 | Bakarian et al. |
| 6,817,003 B2 | 11/2004 | Lippincott et al. |
| 7,143,371 B2 | 11/2006 | Allen et al. |
| 7,155,698 B1 | 12/2006 | Gennari |
| 7,240,305 B2 | 7/2007 | Lippincott |
| 7,240,306 B2 | 7/2007 | Allen et al. |
| 2005/0172247 A1 | 8/2005 | Papadopoulou et al. |
| 2006/0150130 A1 | 7/2006 | Allen et al. |

OTHER PUBLICATIONS

F. Dehne et al.; "The Big Sweep": On the Power of the Wavefront Approach to Voronoi Diagrams; Algorithmica 17; 1997; pp. 19-32.

D. Maynard et al.; Swampfinder; IEEE/Semi Advanced Semiconductor Manufacturing Conference; 2001; pp. 151-155.

F.E. Gennari et al; A Pattern Matching System for Linking TCAD and EDA; IEEE Computer Society; 2004.

D.L. DeMaris et al.; An Information Retrieval System for the Analysis of Systematic Defects in VLSI; IEEE Computer Society; 2004.

(Continued)

*Primary Examiner*—Naum B Levin
(74) *Attorney, Agent, or Firm*—Cantor Colburn LLP; H. Daniel Schnurmann

(57) ABSTRACT

A method for implementing integrated circuit yield estimation includes computing Voronoi regions for an original integrated circuit layout; for each bisector segment of the Voronoi regions and one or more failure mechanisms, computing a failure probability based on geometric parameters of corresponding Voronoi edge regions associated with the bisector segment, using pre-computed failure probabilities as a function of edge orientation and spacing for the failure mechanisms; for each segment of a design edge bounded by bisectors, computing a change in the failure probability based on the geometric parameters of the Voronoi regions, using pre-computed change in failure probabilities for the failure mechanisms; encoding the computed failure probabilities for each Voronoi region in a manner suitable for visual differentiation by a user; and encoding the computed change in failure probabilities by directional displacement of a layout edge segment that would result in a decrease in failure probability.

24 Claims, 7 Drawing Sheets

OTHER PUBLICATIONS

V. Dai et al; DRC Plus: Augmenting Standard DRC With Pattern Matching on 2D Geometries; SPIE Vo. 6521; 2007.

M.Y. Tan; A Survey of Distance Metrics Approximating L2 in the Construction of Voronoi Diagrams for VLSI Applications; 20th Computer Science Seminar, Jul. 20, 2004.

E. Papadopoulou et al.; "Critical Area Computation—A New Approach", ISPD 98; Apr. 6-8, 1998; pp. 89-94.

E. Bengoetxea, Ph.D.; "Chapter 2: The graph matching problem;" Ecok Nationale Superieux des Telecommunications (Paris); 2002; pp. 3-18.

F. Dorn et al., "Efficient Exact Algorithms on Planar Graphs: Exploiting Sphere Cut Decomposisitons", Department of Information and Computing Sciences, Utrecht University; Technical Report UU-CS-2006-006.

D. Eppstein, "Subgraph Isomorphism in Planar Graphs and Related Problems", Journal of Graph Algorithms and Applications vol. 3, No. 3, 1999, pp. 1-27.

Pikus, "Integrated DFM Framwork for Dynamic Yield Optimization" SPIE vol. 6349, 9 Pages; Sep. 19-22, 2006.

Maynard, et al., "Yield Enhancement Using Recommended Ground Rules", IEEE 2004, pp. 98-104.

IMPLEMENTING INTEGRATED CIRCUIT YIELD ESTIMATION USING VORONOI DIAGRAMS

BACKGROUND

The present invention relates generally to integrated circuit device design techniques and, more particularly, to a method and system for implementing integrated circuit yield estimation using Voronoi diagrams.

In designing an integrated circuit (IC) device, engineers or designers typically rely on computer design tools to help create an IC schematic or design, which can include a multitude of individual devices, such as transistors, coupled together to perform a certain function. To actually fabricate the IC device in or on a semiconductor substrate, the IC device schematic must be translated into a physical representation or layout, which itself can then be transferred onto a semiconductor substrate. Computer aided design (CAD) tools can be used to assist layout designers with translating the discrete circuit elements into shapes, which will embody the devices themselves in the completed IC device. These shapes make up the individual components of the circuit, such as gate electrodes, diffusion regions, metal interconnects and the like.

The software programs employed by the CAD systems to produce layout representations are typically structured to function under a set of predetermined design rules in order to produce a functional circuit. Often, the design rules are determined by certain processing and design limitations based roughly on the patternability of layout designs. For example, design rules may define the space tolerance between devices or interconnect lines. Once the layout of the circuit has been created, the next step in manufacturing the IC device is to transfer the layout onto a semiconductor substrate. Optical lithography or photolithography is a well-known process for transferring geometric shapes onto the surface on a semiconductor wafer. The photolithography process generally begins with the formation of a photoresist layer on the top surface of a semiconductor substrate or wafer. A reticle or mask having fully light non-transmissive opaque regions (which are often formed of chrome) and fully light transmissive clear regions (which are often formed of quartz) is then positioned over the photoresist coated wafer.

The mask is placed between a radiation or light source, which can produce light of a pre-selected wavelength (e.g., ultraviolet light) and geometry, and an optical lens system, which may form part of a stepper apparatus. When the light from the light source is directed onto the mask, the light is focused to generate a reduced mask image on the wafer, typically using the optical lens system, which may contain one or several lenses, filters, and/or mirrors. This light passes through the clear regions of the mask to expose the underlying photoresist layer, and is blocked by the opaque regions of the mask, leaving that underlying portion of the photoresist layer unexposed. The exposed photoresist layer is then developed, typically through chemical removal of the exposed or unexposed regions of the photoresist layer. The end result is a semiconductor wafer coated with a photoresist layer exhibiting a desired pattern, which defines the geometries, features, lines and shapes of that layer. This pattern can then be used for etching underlying regions of the wafer.

The physical design of IC devices includes a strict adherence to a set of design ground rules, as well as the recommended use of additional rules to improve yield. However, in certain instances, recommendations for design changes to improve yield may conflict with one another. For example, adding redundant wiring vias improves device yield with respect to electrical opens, but on the other hand device yield is degraded with respect to electrical shorts as a result of the expanded metal shapes associated with the vias. Currently, such tradeoffs are address by either prioritizing the order of the rules to be followed or by drawing on the designer's experience and intuition, which may not result in the best yield.

Accordingly, it would be desirable to be able to implement a quantitative measure of the relative significance of individual defect mechanisms both for assessing tradeoffs and for investing efforts where they would be the most beneficial.

SUMMARY

The foregoing discussed drawbacks and deficiencies of the prior art are overcome or alleviated, in an exemplary embodiment, by a method for implementing integrated circuit yield estimation, including computing Voronoi regions for an original integrated circuit layout; for each bisector segment of the computed Voronoi regions and each of one or more identified integrated circuit failure mechanisms of interest, computing a failure probability based on geometric parameters of corresponding Voronoi edge regions associated with the bisector segment, using pre-computed failure probabilities as a function of edge orientation and spacing for the one or more identified integrated circuit failure mechanisms of interest; for each segment of a design edge bounded by bisectors, computing a change in the failure probability based on the geometric parameters of the associated Voronoi regions therewith, using pre-computed change in failure probabilities as a function of edge orientation and spacing for the one or more identified integrated circuit failure mechanisms of interest; encoding the computed failure probabilities for each Voronoi region in a manner suitable for visual differentiation by a user; and encoding the computed change in failure probabilities by directional displacement of a layout edge segment that would result in a decrease in failure probability.

In another embodiment, a computer program product includes a computer readable computer program code for implementing integrated circuit yield estimation; and instructions for causing a computer to implement a method, the method further including computing Voronoi regions for an original integrated circuit layout; for each bisector segment of the computed Voronoi regions and each of one or more identified integrated circuit failure mechanisms of interest, computing a failure probability based on geometric parameters of corresponding Voronoi edge regions associated with the bisector segment, using pre-computed failure probabilities as a function of edge orientation and spacing for the one or more identified integrated circuit failure mechanisms of interest; for each segment of a design edge bounded by bisectors, computing a change in the failure probability based on the geometric parameters of the associated Voronoi regions therewith, using pre-computed change in failure probabilities as a function of edge orientation and spacing for the one or more identified integrated circuit failure mechanisms of interest; encoding the computed failure probabilities for each Voronoi region in a manner suitable for visual differentiation by a user; and encoding the computed change in failure probabilities by directional displacement of a layout edge segment that would result in a decrease in failure probability.

In another embodiment, a system for implementing integrated circuit yield estimation includes a computing network including a processing device in communication with one or more computer memory storage devices; and the computing network further including a software architecture for implementing integrated circuit yield estimation. The architecture further includes a yield tradeoff assessor (YTA) that computes Voronoi regions for an original integrated circuit layout. The YTA is further configured to compute, for each bisector segment of the computed Voronoi regions and each of one or more identified integrated circuit failure mechanisms of interest, a failure probability based on geometric parameters of corresponding Voronoi edge regions associated with the bisector segment, using pre-computed failure probabilities as a function of edge orientation and spacing for the one or more identified integrated circuit failure mechanisms of interest. The YTA is further configured to compute, for each segment of a design edge bounded by bisectors, a change in the failure probability based on the geometric parameters of the associated Voronoi regions therewith, using pre-computed change in failure probabilities as a function of edge orientation and spacing for the one or more identified integrated circuit failure mechanisms of interest. In addition, the YTA is further configured to encode the computed failure probabilities for each Voronoi region in a manner suitable for visual differentiation by a user, and to encode the computed change in failure probabilities by directional displacement of a layout edge segment that would result in a decrease in failure probability.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 1:
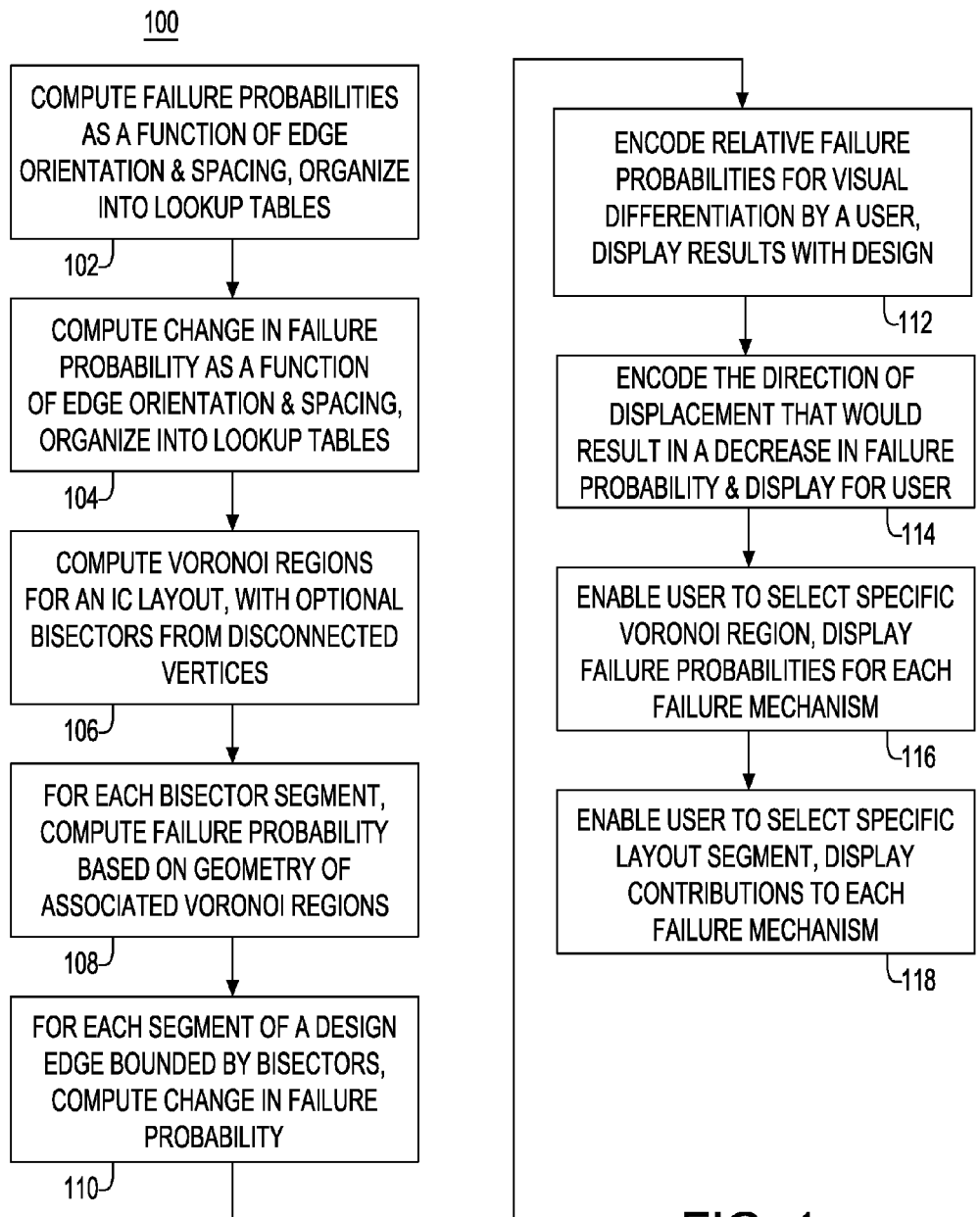
FIG. 1 is a process flow diagram illustrating a method for implementing integrated circuit yield estimation using Voronoi diagrams, in accordance with an embodiment of the invention.

Disclosed herein is a method and system for implementing IC yield estimation using Voronoi diagrams. The computation of the probability of electrical failure resulting from variations in the manufacturing process for pairs of edges in an IC design is well understood and provides the basis for generating the design ground rules and recommended rules. An integrated circuit design, however, contains billions of interacting edges, resulting in a very complex set of computations. Accordingly, the embodiments described herein address this complexity by using Voronoi regions to partition the computation into many simple computations of the probability of failure between edge pairs and then aggregating the probabilities to arrive at a failure probability (yield loss) for the entire design. The relative contributions to the yield loss of individual edge pairs may be visualized and shapes may be adjusted to ameliorate that loss. In contrast, existing approaches independently compute the contributions of individual yield loss mechanisms and combine them only at the global level. Thus, the contributions of individual edge pairs can only be computed by keeping the remainder of the design fixed. In other words, the computation has to be repeated for each possible design variation.

As indicated above, an IC physical design includes several layers of design shapes representing features to be manufactured on a semiconductor chip. Sometimes, the interaction of shapes on a single design layer is of interest; other times, interactions of shapes across two or more layers are of interest. Queries across more than one layer can be accommodated by either a Boolean combination of results or by using a derived design layer constructed from Boolean combinations of the original layers. For purposes of illustration, the case of a pattern on a single design layer is discussed herein, however it will be appreciated that the present embodiments also apply to Boolean combinations of results and/or layers.

With respect to Voronoi computations as discussed herein, the Voronoi regions associated with pairs of edges may be computed inside closed shapes (interior Voronoi regions) and between shapes (exterior Voronoi regions). The boundaries between the regions are called bisectors, which represent the locus of points equidistant from the two relevant edges. It should be understood that the metric used to measure this distance need not be the familiar Euclidian distance; rather, for efficiency of computation and pattern representation, other distance metrics are preferred. For example, distance metrics discussed by Mervyn Tan in "A Survey of Distance Metrics Approximating L2 in the Construction of Voronoi Diagrams for VLSI Applications" ($20^{th}$ Computer Science Seminar, Apr. 24, 2004) include unit shapes represented as octagons with edges that lie on orthogonal and directions 45 degrees to orthogonal (e.g., metrics "M3", "M4" and "M5" as termed by Tan).

Such octal metrics are particularly useful for analyzing IC layouts, as IC designs are primarily restricted to shapes with orthogonal edges along the two dimensional (2D) axes of the design. The octal metrics measure distances between these edges exactly and also generate Voronoi regions for interacting corners of the design shapes. In addition, when IC designs use edges other than orthogonal, they are usually 45 degrees with respect to orthogonal and can be accommodated well by the octal metrics. Thus although the embodiments described herein may use other distance metrics besides octal, an octal metric is used for purposes of illustration.

Voronoi edge regions are bounded by a single edge of a design shape and by two or more bisectors. A point where two or more bisectors intersect is called a vertex. If a Voronoi region contains vertices not connected by a bisector to the design shape, a bisector may optionally be added from that vertex to the design edge, wherein the bisector is normal to the design edge. This results in simplifying the Voronoi regions to having only three or four sides, which in turn simplifies the collection of different pattern elements. Thus, although this simplification technique of Voronoi regions need not be utilized in order to implement the present invention embodiments, it is described herein for purposes of illustration.

Referring now to FIG. 1, there is shown a process flow diagram illustrating a method 100 for implementing integrated circuit yield estimation using Voronoi diagrams, in accordance with an embodiment of the invention. As shown in block 102, the method 100 begins with a preliminary event of computing failure probabilities (p) as a function of edge orientation and spacing for failure mechanisms of interest. The computed failure probabilities are organized into lookup tables indexed by the geometric parameters. In addition, comments may be stored with the probabilities that describe the means of computation and the values used for each table. Then, as shown in block 104, another preliminary event is to compute the change in failure probability (Δp) as a function of edge orientation and spacing for the failure mechanisms of interest. The computed change in failure probabilities are also organized into lookup tables indexed by the geometric parameters, with comments being stored in the tables that describe the means of computation and the values used.

As described in further detail below, the failure lookup tables populated with the failure probabilities and change in failure probabilities values are preprogrammed prior to implementing a specific mechanism (referred to herein after as a Yield Tradeoff Assessor or YTA) that accesses the information in the tables. Subsequent to block 104, the remaining operations depicted in FIG. 1 may be implemented, for example, by the YTA.

Referring still to FIG. 1, the YTA computes Voronoi regions for an integrated circuit layout, and optionally adds bisectors from disconnected vertices as described above in order to simplify the Voronoi regions to having three or four sides, as indicated in block 106. Then, as shown in block 108, for each bisector segment and failure mechanism of interest, the failure probability is computed based on the geometric parameters of the associated Voronoi edge regions of interest using the lookup table information as initially programmed from block 102. As further shown in block 110, for each segment of a design edge that is bounded by bisectors, the change in failure probability is then computed based on the geometric parameters of the associated Voronoi regions of interest using the lookup table information as initially programmed from block 104.

Proceeding to block 112, the relative failure probabilities computed in block 108 are encoded (e.g., using a color coded scheme) to fill the area defined by each region for visual differentiation by a user, with the results presented to the user along with the original layout. As further shown in block 114, the method further encodes the direction of displacement that would result in a decrease in failure probability based on the computations in block 110, as a shift in the drawn position of the segment of the layout edge. The results are also presented for display to the user along with the original layout. Optionally, at the user's discretion, the displays presented in block 112 and 114 may be presented either separately or simultaneously.

As shown in block 116, the method 100 further enables the user to select a specific Voronoi region displayed in block 112 that, when selected, presents the failure probabilities for each failure mechanism computed for that region. In addition, the user is further allowed to select a specific failure mechanism that, when selected, presents the comments described in block 102 used in performing the probability computations. Finally, as shown in block 118, the user is further allowed to select a particular layout segment of the display generated in block 114 that, when selected, presents the contributions for each failure mechanism computed for that edge segment. The user is further allowed to select a specific failure mechanism that, when selected, presents the comments described in block 104 used in performing the change in probability computations.

Figure 2:
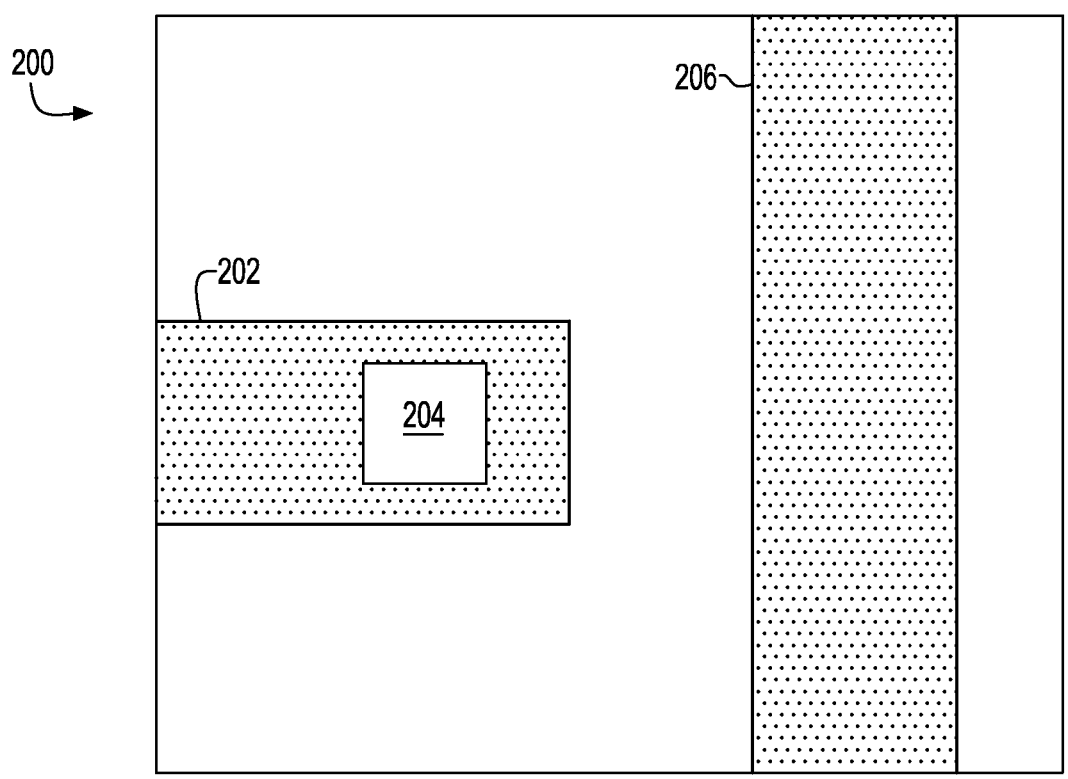
FIG. 2 illustrates an original layout of an exemplary integrated circuit region feature to which the yield estimation methodology of FIG. 1 may be applied.
Figure 3A:
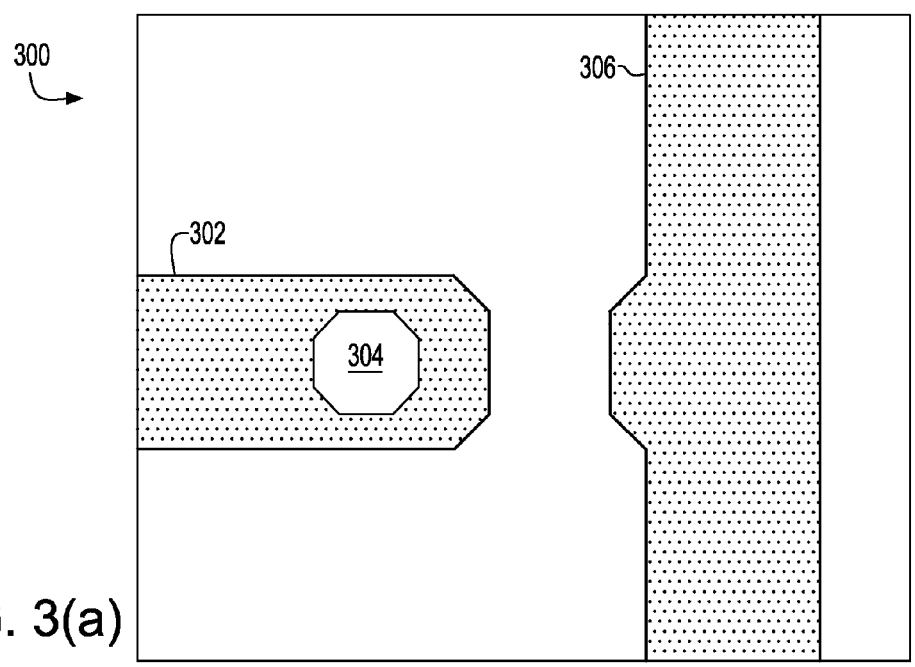
FIG. 3(a) is a modified view of the IC feature of FIG. 2, optionally taking into account lithography simulations of the IC feature.

FIG. 2 illustrates an original layout of an exemplary integrated circuit region feature 200 to which the yield estimation methodology of FIG. 1 may be applied. In particular, a first metal line 202 having a contact 204 (e.g., via) formed thereon is disposed adjacent a second metal line 206, in what is referred to as a "line end to side" feature. In exemplary embodiments, the above described Voronoi yield estimation methodology may be applied directly to an original layout, such as shown in FIG. 2. Alternatively however, the original layout feature 200 may also be subjected to other design simulations, such as lithography modeling for example, in order to model the uncertainty in the position of edges. Thus, although the details of such simulations are beyond the scope of the present disclosure, the original layout of FIG. 2 is shown as lithography simulation layout 300 in FIG. 3(a), including first metal line 302, contact 304 and second metal line 306. This geometry provides a more robust example of Voronoi regions used in yield estimation.

Figure 3B:
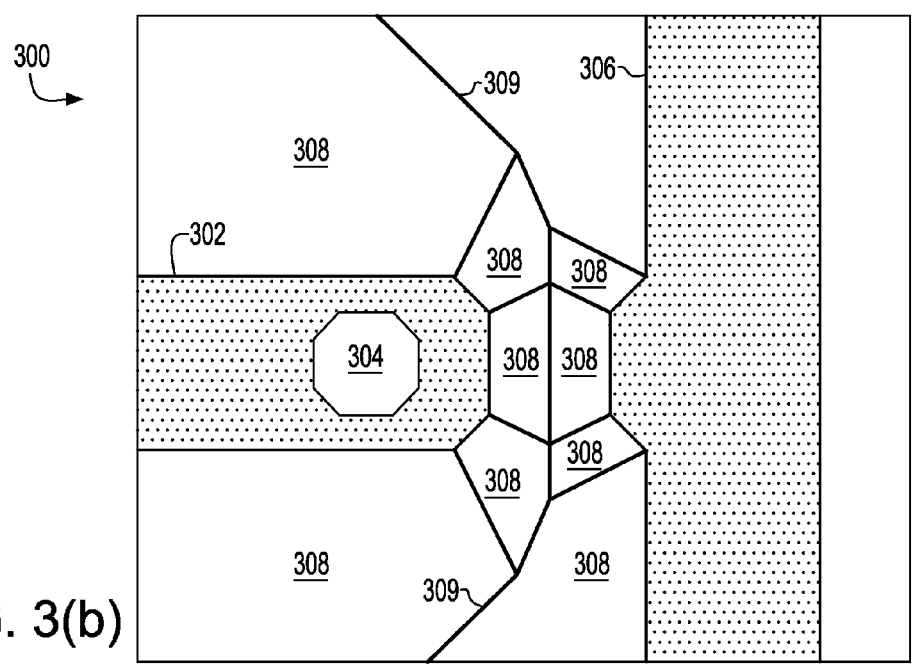
FIGS. 3(b) through 3(f) illustrate the computation of Voronoi regions used for determining metal-to-metal and metal-to-contact failure probabilities of the layout in FIG. 3(a)
Figure 3C:
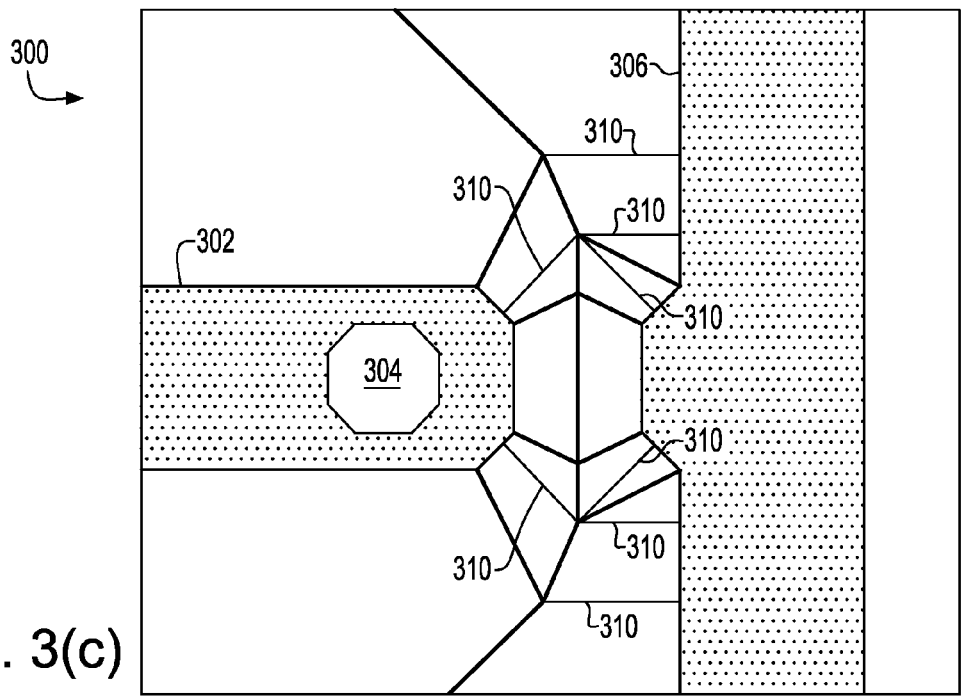
Figure 3D:
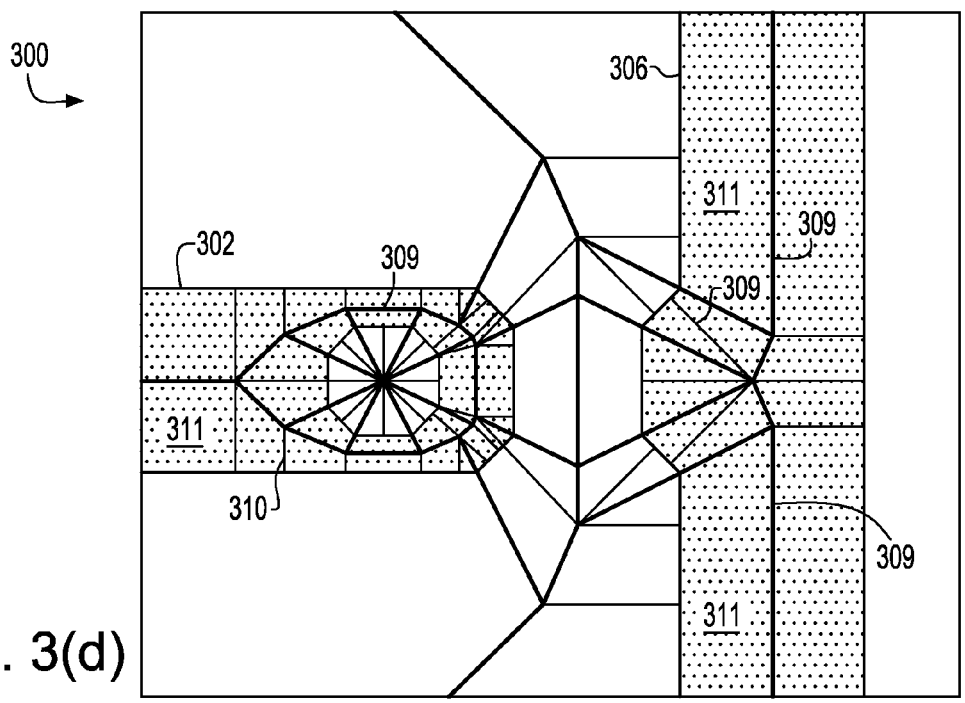

As further shown in FIG. 3(b), layout 300 is partitioned into exterior Voronoi regions 308 for the metal-to-metal interactions, using an octal distance metric such as discussed above. Each exterior Voronoi edge region 308 is bounded by a single edge of the design shape and two or more bisectors 309. As also indicated above, additional bisectors or transition boundaries may be added for Voronoi regions containing vertices not connected by a bisector to the design shape to simplify the Voronoi regions to three or four sides. These additional bisectors 310 are depicted in FIG. 3(c). As further shown in FIG. 3(d), the interior Voronoi regions 311 for the metal-to-contact interactions are defined using the same technique as for Voronoi bisectors and additional bisectors of the exterior regions. To simplify the depiction of Voronoi regions in FIG. 3(d), only the newly added interior regions 311 and representative bisectors 309, 310 are labeled therein.

Figure 3E:
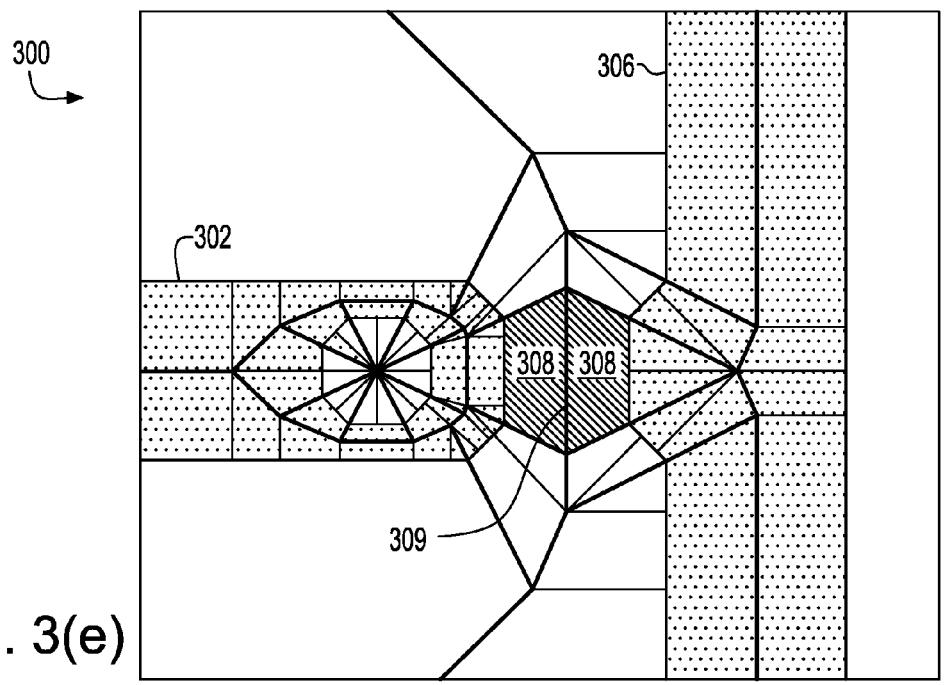
Figure 3F:
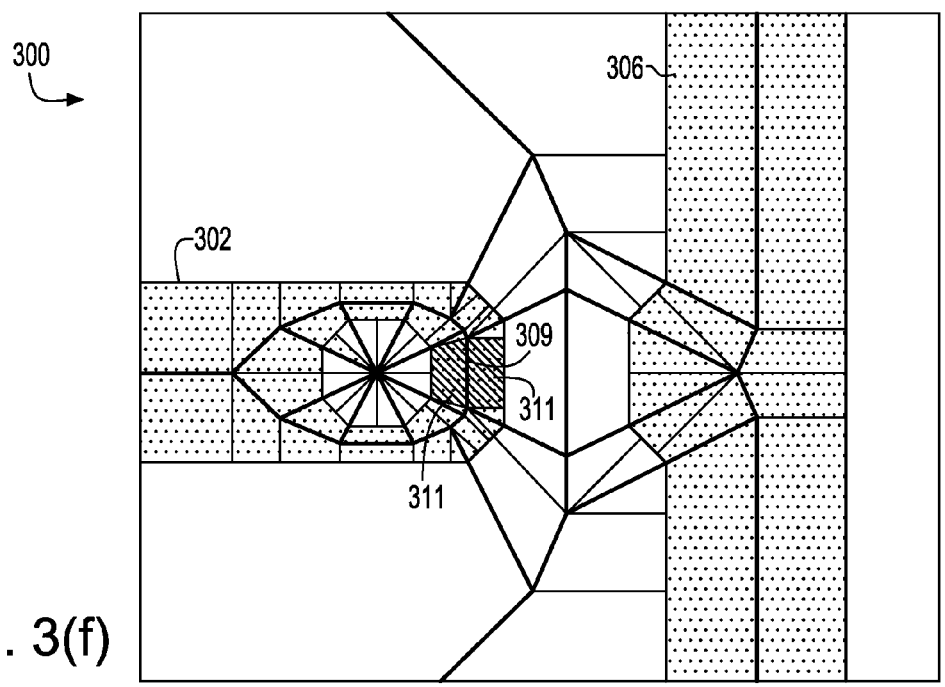

As was indicated above, the present methodology adopts a piecewise approach to failure probability computation in that, for each bisector segment and each failure mechanism of interest, the failure probability of the associated Voronoi edge regions are computed (block 108 of FIG. 1). The same is true for the computation of a change in failure probability (block 110 of FIG. 1). In FIG. 3(e), the highlighted bisector segment 309 and shaded exterior Voronoi region pair 308 represent an area of interest in terms of a metal-to-metal failure probability (i.e., metal line 302 with respect to metal line 306). In comparison, the highlighted bisector segment 309 and shaded interior Voronoi region pair 311 in FIG. 3(f) represent an area of interest in terms of a metal-to-contact failure probability (i.e., metal line 302 with respect to contact 304).

It will be appreciated that the above descriptions of exemplary presentations to the user with respect to the layout (e.g., failure probabilities, change in failure probabilities with respect to direction, etc.) may be implemented in any suitable manner known in the art of computer displays and graphical representations.

Figure 4:
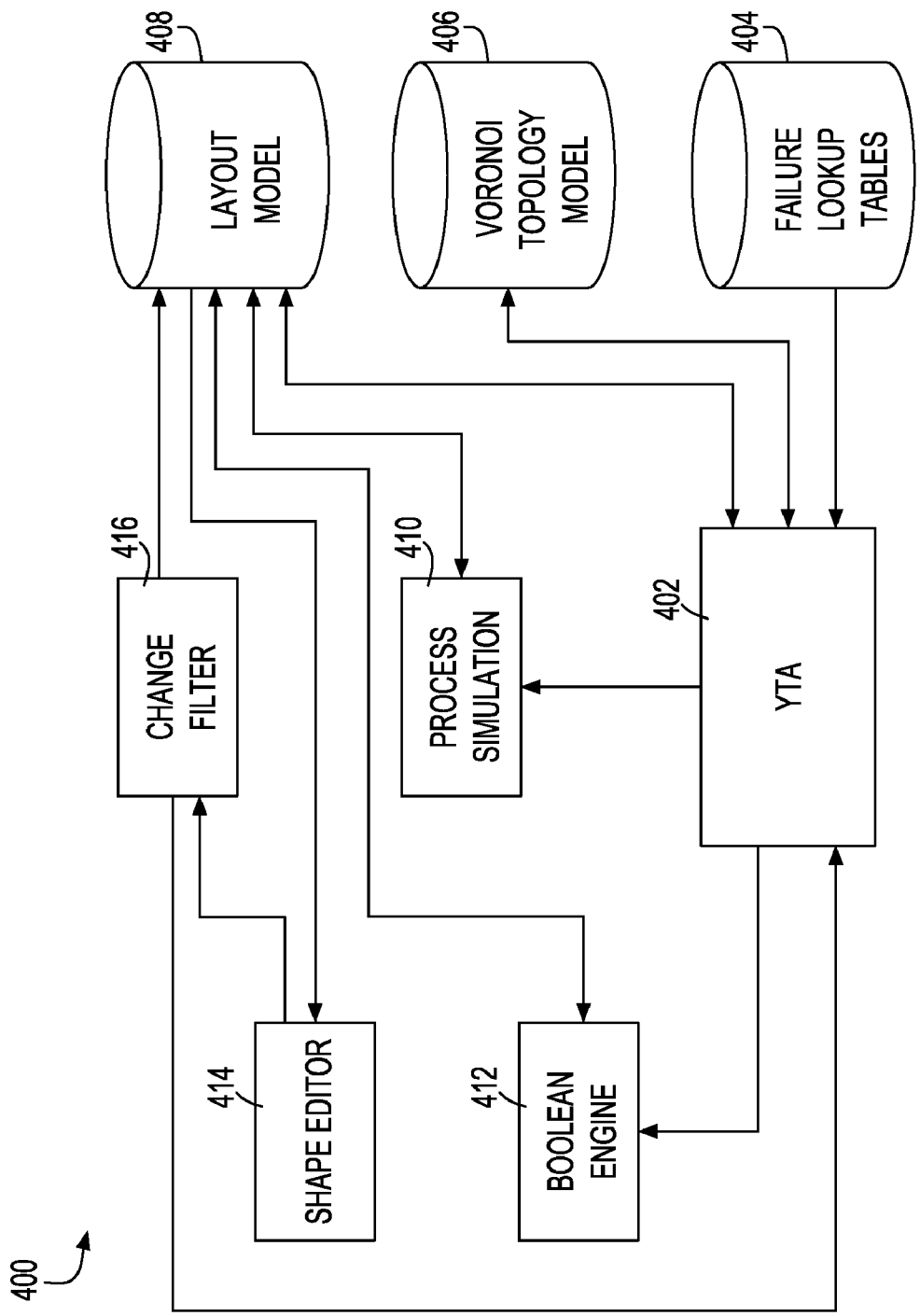
FIG. 4 is a schematic block diagram of an exemplary software architecture suitable for practicing embodiments of the present invention.

Referring now to FIG. 4, there is shown a schematic block diagram of an exemplary software architecture 400 suitable for practicing embodiments of the present invention. As is shown, architecture includes a Yield Tradeoff Assessor (YTA) 402, failure lookup tables 404, Voronoi topology model 406, layout model 408, process simulation block 410, Boolean engine 412, shape editor 414, and change filter 416.

The failure lookup tables 404 are populated with the failure probability and change in failure probability data as a function of edge orientations and the failure mechanisms of interest, computed in accordance with blocks 102 and 104 of FIG. 1. By implementing a fast lithography simulation using simulation block 410, the uncertainties in the position of printed edges can be modeled to remove (as much as practical) predictable systematic variations. Thus, the layout model 408 may be programmed to include, for example, edges that lie on orthogonal and directions 45 degrees to orthogonal.

As was also indicated above, shapes of interest across more than one layer can be accommodated by either a Boolean combination of results or by using a derived design layer constructed from Boolean combinations of the original layers. Thus, the Boolean engine 412 may be called upon by the YTA 402 to construct Boolean combinations of shapes of interest for inclusion in the layout model 408. In conjunction with block 106 of FIG. 1, the Voronoi regions of the layout are computed wherein neighborhood information and references to layout data are stored in the Voronoi topology model 406, and the Layout model 408 contains Voronoi regions linked to the topology with attributes.

Using the previously stored failure probability and derivatives thereof in lookup tables 404, the YTA computes failure probabilities and the spatial derivatives thereof (block 108, 110 of FIG. 1), and adds this information to the Voronoi topology model 406. The Voronoi computation results are then graphically encoded (e.g., by color coding) and made available to the user through the shape editor 414. The user may then interact with the system to drill down to and view the process assumptions for a given selected layout feature and failure mechanism. Exemplary process assumptions may include, for example, but are not limited to: etch stop thickness, silicide width, worst case aspect ratios for via contacts, image, print and etch tolerances, difference between image and resist targets etc. Further, with the use of the change filter 416 and shape editor 414, the user may implement incremental changes in the layout to see what effects they may have on the failure probabilities. In this instance, any Voronoi regions affected by the incremental change would be marked as invalid in the Voronoi topology mode.

Figure 5:
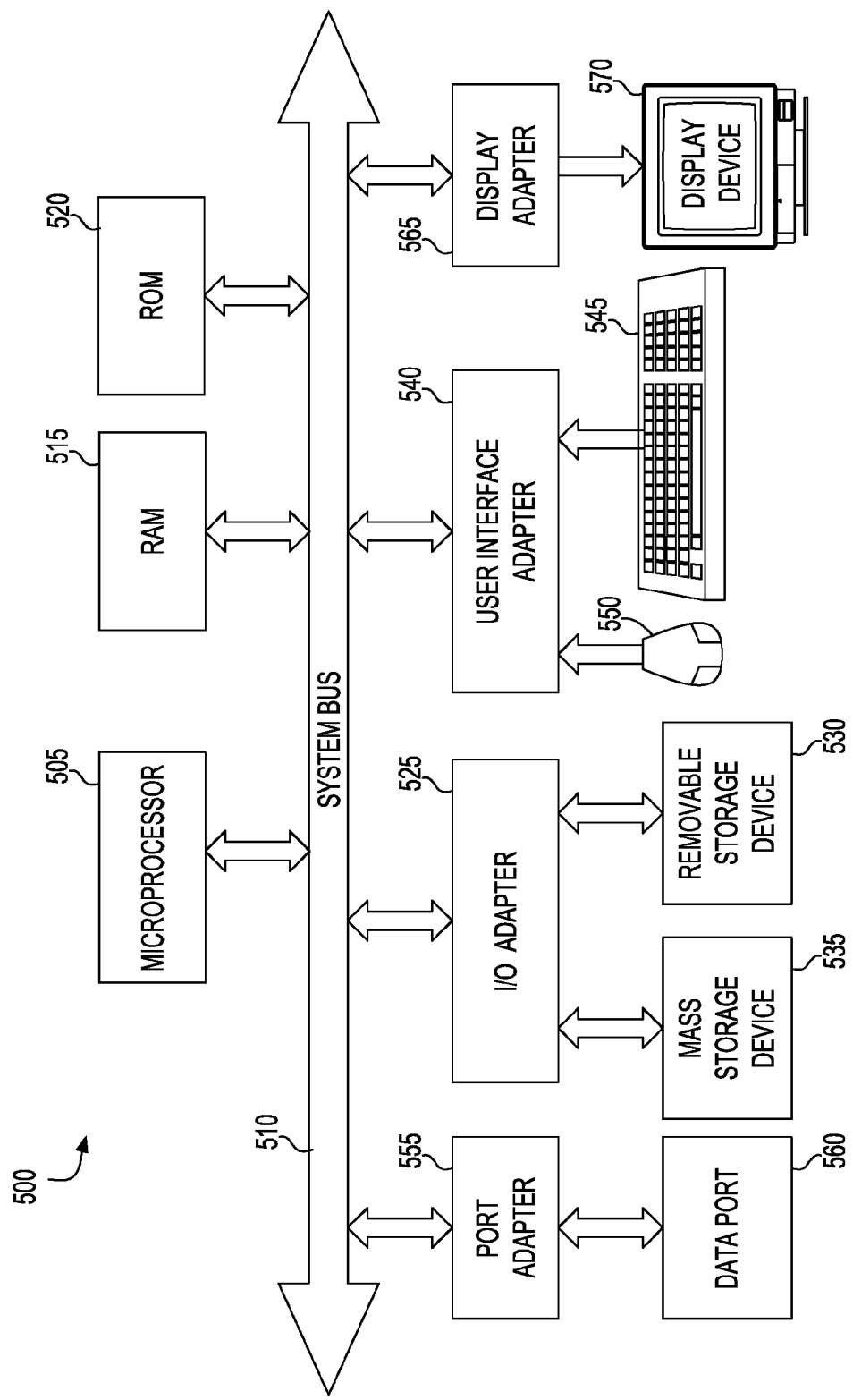
FIG. 5 is a schematic block diagram of a general-purpose computing system suitable for practicing embodiments of the present invention.

Generally, the method embodiments for implementing IC yield estimation using Voronoi diagrams may be practiced with a general-purpose computer and the method may be coded as a set of instructions on removable or hard media for use by the general-purpose computer. FIG. 5 is a schematic block diagram of a general-purpose computing system suitable for practicing embodiments of the present invention. In FIG. 5, computing system 500 has at least one microprocessor or central processing unit (CPU) 505. CPU 505 is interconnected via a system bus 510 to a random access memory (RAM) 515, a read-only memory (ROM) 520, an input/output (I/O) adapter 525 for a connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570.

ROM 520 contains the basic operating system for computing system 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include hard disk drives and non-volatile memory such as flash memory. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 530, fed through data port 560 or typed in using keyboard 545.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary method described above and illustrated in FIG. 1.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for implementing integrated circuit yield estimation, the method comprising:
   using a computer for:
   computing Voronoi regions for an original integrated circuit layout;
   for each bisector segment of the computed Voronoi regions and each of one or more identified integrated circuit failure mechanisms of interest, computing a failure probability based on geometric parameters of corresponding Voronoi edge regions associated with the bisector segment, using pre-computed failure probabilities as a function of edge orientation and spacing for the one or more identified integrated circuit failure mechanisms of interest;
   for each segment of a design edge bounded by bisectors, computing a change in the failure probability based on the geometric parameters of the associated Voronoi regions therewith, using pre-computed change in failure probabilities as a function of edge orientation and spacing for the one or more identified integrated circuit failure mechanisms of interest;
   encoding the computed failure probabilities for each Voronoi region in a manner suitable for visual differentiation by a user; and
   encoding the computed change in failure probabilities by directional displacement of a layout edge segment that would result in a decrease in failure probability.

2. The method of claim 1, wherein the Voronoi regions are defined using an octal distance metric.

3. The method of claim 1, further comprising defining additional bisectors for Voronoi edge regions containing vertices not connected by a bisector to a design shape, thereby simplifying all Voronoi edge regions so as to have either three or four sides.

4. The method of claim 1, wherein the encoded failure probabilities and change in failure probabilities are displayed to a user along with the original integrated circuit layout.

5. The method of claim 1, further comprising receiving a specific Voronoi region selected by the user and displaying the failure probabilities for the Voronoi region for each of the one or more identified integrated circuit failure mechanisms of interest.

6. The method of claim 5, further comprising receiving a selection of a specific failure mechanism of interest by the user and displaying one or more comments associated with the pre-computed failure probabilities as a function of edge orientation and spacing.

7. The method of claim 1, further comprising receiving a specific layout segment selected by the user and displaying the change in the failure probability based on the geometric parameters of the associated Voronoi regions therewith.

8. The method of claim 7, further comprising receiving a selection of a specific failure mechanism of interest by the user and displaying one or more comments associated with the pre-computed change in failure probabilities as a function of edge orientation and spacing.

9. A computer program product, comprising:
a storage device for storing a computer readable program code for implementing integrated circuit yield estimation; and
instructions for causing a computer to implement a method, the method further comprising:
computing Voronoi regions for an original integrated circuit layout;
for each bisector segment of the computed Voronoi regions and each of one or more identified integrated circuit failure mechanisms of interest, computing a failure probability based on geometric parameters of corresponding Voronoi edge regions associated with the bisector segment, using pre-computed failure probabilities as a function of edge orientation and spacing for the one or more identified integrated circuit failure mechanisms of interest;
for each segment of a design edge bounded by bisectors, computing a change in the failure probability based on the geometric parameters of the associated Voronoi regions therewith, using pre-computed change in failure probabilities as a function of edge orientation and spacing for the one or more identified integrated circuit failure mechanisms of interest;
encoding the computed failure probabilities for each Voronoi region in a manner suitable for visual differentiation by a user; and
encoding the computed change in failure probabilities by directional displacement of a layout edge segment that would result in a decrease in failure probability.

10. The computer program product of claim 9, wherein the Voronoi regions are defined using an octal distance metric.

11. The computer program product of claim 9, wherein the method further comprises defining additional bisectors for Voronoi edge regions containing vertices not connected by a bisector to a design shape, thereby simplifying all Voronoi edge regions so as to have either three or four sides.

12. The computer program product of claim 9, wherein the encoded failure probabilities and change in failure probabilities are displayed to a user along with the original integrated circuit layout.

13. The computer program product of claim 9, wherein the method further comprises receiving a specific Voronoi region selected by the user and displaying the failure probabilities for the Voronoi region for each of the one or more identified integrated circuit failure mechanisms of interest.

14. The computer program product of claim 13, wherein the method further comprises receiving a selection of a specific failure mechanism of interest by the user and displaying one or more comments associated with the pre-computed failure probabilities as a function of edge orientation and spacing.

15. The computer program product of claim 9, wherein the method further comprises receiving a specific layout segment selected by the user and displaying the change in the failure probability based on the geometric parameters of the associated Voronoi regions therewith.

16. The computer program product of claim 15, wherein the method further comprises receiving a selection of a specific failure mechanism of interest by the user and displaying one or more comments associated with the pre-computed change in failure probabilities as a function of edge orientation and spacing.

17. A system for implementing integrated circuit yield estimation, comprising:
a computing network including a processing device in communication with one or more computer memory storage devices; and
the computing network further including a software architecture for implementing integrated circuit yield estimation, the architecture further comprising:
a yield tradeoff assessor (YTA) that computes Voronoi regions for an original integrated circuit layout;
the YTA further configured to compute, for each bisector segment of the computed Voronoi regions and each of one or more identified integrated circuit failure mechanisms of interest, a failure probability based on geometric parameters of corresponding Voronoi edge regions associated with the bisector segment, using pre-computed failure probabilities as a function of edge orientation and spacing for the one or more identified integrated circuit failure mechanisms of interest;
the YTA further configured to compute, for each segment of a design edge bounded by bisectors, a change in the failure probability based on the geometric parameters of the associated Voronoi regions therewith, using pre-computed change in failure probabilities as a function of edge orientation and spacing for the one or more identified integrated circuit failure mechanisms of interest;
the YTA further configured to encode the computed failure probabilities for each Voronoi region in a manner suitable for visual differentiation by a user; and
the YTA further configured to encode the computed change in failure probabilities by directional displacement of a layout edge segment that would result in a decrease in failure probability.

18. The system of claim 17, wherein the Voronoi regions are defined using an octal distance metric.

19. The system of claim 17, wherein the YTA is further configured to define additional bisectors for Voronoi edge regions containing vertices not connected by a bisector to a design shape, thereby simplifying all Voronoi edge regions so as to have either three or four sides.

20. The system of claim 17, wherein the encoded failure probabilities and change in failure probabilities are displayed to a user along with the original integrated circuit layout.

21. The system of claim 17, wherein the YTA is further configured to receive a specific Voronoi region selected by the user and display the failure probabilities for the Voronoi region for each of the one or more identified integrated circuit failure mechanisms of interest.

22. The system of claim 21, wherein the YTA is further configured to receive a selection of a specific failure mechanism of interest by the user and display one or more comments associated with the pre-computed failure probabilities as a function of edge orientation and spacing.

23. The system of claim 17, wherein the YTA is further configured to receive a specific layout segment selected by the user and display the change in the failure probability based on the geometric parameters of the associated Voronoi regions therewith.

24. The system of claim 23, wherein the YTA is further configured to receive a selection of a specific failure mechanism of interest by the user and display one or more comments associated with the pre-computed change in failure probabilities as a function of edge orientation and spacing.

* * * * *